(12) United States Patent
Franz et al.

(10) Patent No.: US 10,837,719 B2
(45) Date of Patent: Nov. 17, 2020

(54) FLUID MANIFOLD

(71) Applicant: HEWLETT PACKARD ENTERPRISE DEVELOPMENT LP, Houston, TX (US)

(72) Inventors: John P Franz, Houston, TX (US); Tahir Cader, Liberty Lake, WA (US); William K Norton, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 400 days.

(21) Appl. No.: 15/120,512

(22) PCT Filed: May 15, 2014

(86) PCT No.: PCT/US2014/038168
§ 371 (c)(1),
(2) Date: Aug. 19, 2016

(87) PCT Pub. No.: WO2015/174983
PCT Pub. Date: Nov. 19, 2015

(65) Prior Publication Data
US 2016/0356558 A1   Dec. 8, 2016

(51) Int. Cl.
*F28F 9/00* (2006.01)
*F28F 9/02* (2006.01)
(Continued)

(52) U.S. Cl.
CPC ............ *F28F 9/0248* (2013.01); *F16L 41/03* (2013.01); *F28D 1/05325* (2013.01);
(Continued)

(58) Field of Classification Search
CPC ........ F28F 9/0248; F28F 9/0202; F28F 27/00; F28F 9/02; F28F 9/0214; F28F 9/013;
(Continued)

(56) References Cited

U.S. PATENT DOCUMENTS 4,236,577 A * 12/1980 Neudeck ................... F28F 9/06
165/175
5,477,919 A * 12/1995 Karube ............... F28D 1/05391
165/176
(Continued)

FOREIGN PATENT DOCUMENTS

CN     102929372 A     2/2013
CN     103219559 A     7/2013
(Continued)

OTHER PUBLICATIONS

PCT/ISA/KR, International Search Report dated Jan. 23, 2015, PCT/US2014/038168, 9 ps.
(Continued)

*Primary Examiner* — Travis C Ruby
*Assistant Examiner* — Harry E Arant
(74) *Attorney, Agent, or Firm* — Hewlett Packard Enterprise Patent Department

(57) ABSTRACT

An apparatus is provided herein. The apparatus includes a support member, a supply channel, a return channel, a supply port to provide a fluid to the supply channel, a return port to receive the fluid from the return channel, at least two port fittings, a first sleeve, and a second sleeve. The first sleeve is connectable to one of the at least two port fittings and forms a fluid tight seal between the first sleeve and the supply channel. The second sleeve is connectable to the other of the at least two port fittings and forms a fluid tight seal between the second sleeve and the return channel.

18 Claims, 9 Drawing Sheets

(51) Int. Cl.
- *F16L 41/03* (2006.01)
- *H05K 7/20* (2006.01)
- *F28D 1/053* (2006.01)
- *F28F 27/00* (2006.01)
- *F16L 39/06* (2006.01)
- *F28D 21/00* (2006.01)

(52) U.S. Cl.
CPC ............ *F28F 9/0202* (2013.01); *F28F 27/00* (2013.01); *H05K 7/20272* (2013.01); *H05K 7/20772* (2013.01); *F16L 39/06* (2013.01); *F28D 2021/0028* (2013.01); *F28F 2230/00* (2013.01); *F28F 2265/16* (2013.01)

(58) Field of Classification Search
CPC .................. F28F 9/0246; F28F 9/0251; F28F 2009/0287; F28D 1/05325; F16L 41/03
USPC .................................................. 165/140, 175
See application file for complete search history.

(56) References Cited

U.S. PATENT DOCUMENTS

| | | | |
|---|---|---|---|
| 5,540,278 A * | 7/1996 | Chiba | F28D 1/05341 165/173 |
| 6,574,104 B2 | 6/2003 | Patel et al. | |
| 7,484,555 B2 * | 2/2009 | Beamer | F28D 1/05375 165/153 |
| 8,276,397 B1 | 10/2012 | Carlson et al. | |
| 8,351,200 B2 | 1/2013 | Arimilli et al. | |
| 2010/0002393 A1 | 1/2010 | Campbell | |
| 2011/0240281 A1 | 10/2011 | Avery | |
| 2012/0123595 A1 | 5/2012 | Bower, III et al. | |
| 2012/0160925 A1 | 6/2012 | Hoisington | |
| 2013/0043775 A1 | 2/2013 | Chen | |
| 2013/0183555 A1 * | 7/2013 | Boddakayala | H01M 2/1077 429/72 |
| 2013/0264046 A1 | 10/2013 | Chainer et al. | |
| 2013/0312846 A1 | 11/2013 | Eriksen et al. | |
| 2014/0085821 A1 | 3/2014 | Regimbal et al. | |

FOREIGN PATENT DOCUMENTS

| | | |
|---|---|---|
| CN | 103635261 | 3/2014 |
| EP | 2568794 A2 | 3/2013 |
| TW | 201237339 A | 9/2012 |
| TW | 201310872 B | 3/2013 |
| WO | WO-2014051604 | 4/2014 |

OTHER PUBLICATIONS

Extended European Search Report, EP Application No. 14891647.1, dated Nov. 27, 2017, pp. 1-9, EPO.

* cited by examiner

FLUID MANIFOLD

BACKGROUND

Electronic devices have temperature requirements. Heat from the use of the electronic devices is controlled using cooling systems. Examples of cooling systems include air and liquid cooling.

BRIEF DESCRIPTION OF THE DRAWINGS

Non-limiting examples of the present disclosure are described in the following description, read with reference to the figures attached hereto and do not limit the scope of the claims. In the figures, identical and similar structures, elements or parts thereof that appear in more than one figure are generally labeled with the same or similar references in the figures in which they appear. Dimensions of components and features illustrated in the figures are chosen primarily for convenience and clarity of presentation and are not necessarily to scale. Referring to the attached figures:

DETAILED DESCRIPTION

In the following detailed description, reference is made to the accompanying drawings which form a part hereof, and in which is depicted by way of illustration specific examples in which the present disclosure may be practiced. It is to be understood that other examples may be utilized and structural or logical changes may be made without departing from the scope of the present disclosure.

Electronic system designs must balance conflicts between power density, spatial layout, temperature requirements, acoustic noise, and other factors. Air cooling systems typically use heat sinks and fans to remove "waste" heat from the system. The use of heat sinks and fans increase the electrical power required to operate an electronic device in an electronic system, and may cause excessive acoustic noise and lower system density. Liquid cooling can be more efficient than air cooling; however, the liquid cooling typically includes plumbing connections within the electronic devices. As the liquid goes through the plumbing connections the risk of leakage of liquid within the electronic device is introduced.

In examples, an apparatus is provided. The apparatus includes a support member, a supply channel, a return channel, a supply port to provide a fluid to the supply channel, a return port to receive the fluid from the return channel, at least two port fittings, a first sleeve, and a second sleeve. The first sleeve is connectable to one of the at least two port fittings. The first sleeve includes a first length with a first gasket to form a fluid tight seal between the first sleeve and the supply channel. The second sleeve is connectable to the other of the at least two port fittings. The second sleeve includes a second length with a second gasket to form a fluid tight seal between the second sleeve and the return channel.

The apparatus provides a fluid manifold configuration to accommodate the space constraints that exist with densely packed electronics, such as servers.

The phrase "active/passive valve" refers to a valve that is passively controlled based on a reaction to the fluid, such as the temperature, pressure, flow rate, and/or actively controlled based on instructions or signals from a monitoring device.

Figure 1:
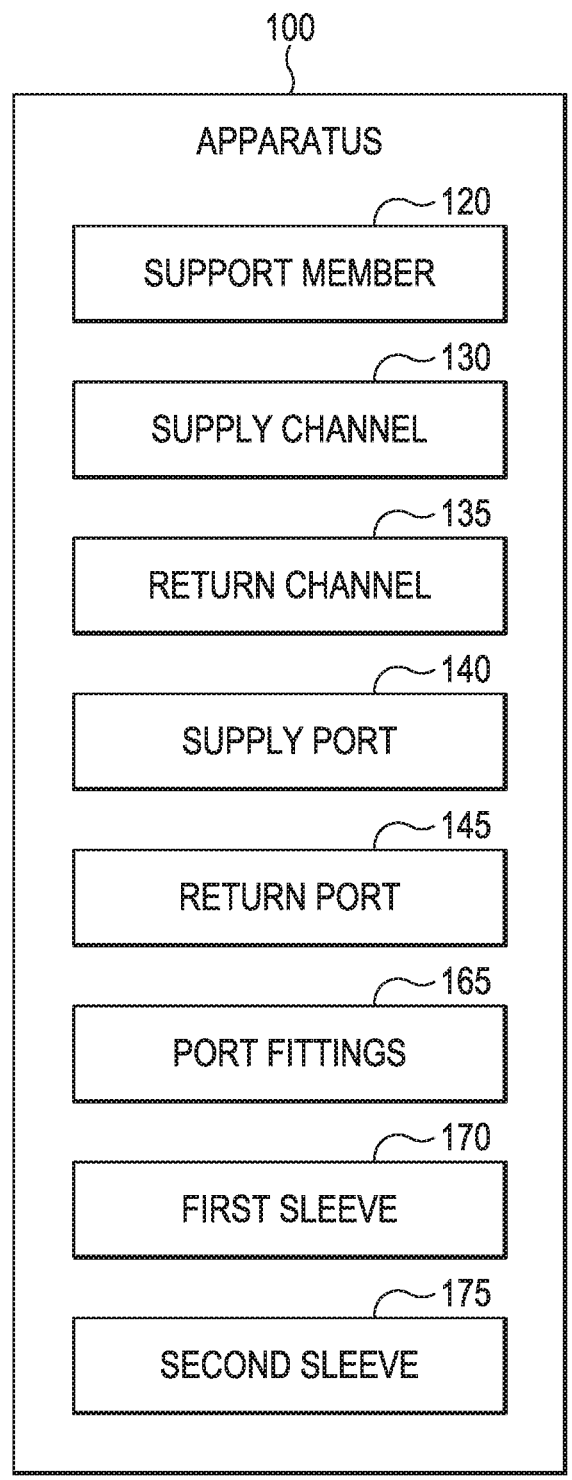
FIG. 1 illustrates a block diagram of an apparatus according to an example.

FIG. 1 illustrates a block diagram of an apparatus 100 according to an example. The apparatus 100 includes a support member 120, a supply channel 130, a return channel 135, a supply port 140, a return port 145, at least two port fittings 165, a first sleeve 170, and a second sleeve 175. The support member 120 includes the supply channel 130 and the return channel 135, which may be used to form a fluid manifold. The supply port 140 to provide a fluid to the supply channel 130. The return port 145 to receive the fluid from the return channel 135. The at least two port fittings 165, one for the supply port 140 and the other for the return port 145. The first sleeve 170 is connectable to one of the at least two port fittings 165. The first sleeve 170 having a first length with a first gasket to form a fluid tight seal between the first sleeve 170 and the supply channel 130. The second sleeve 175 is connectable to the other of the at least two port fittings 165. The second sleeve 175 having a second length with a second gasket to form a fluid tight seal between the second sleeve 175 and the return channel 135.

Figure 2:
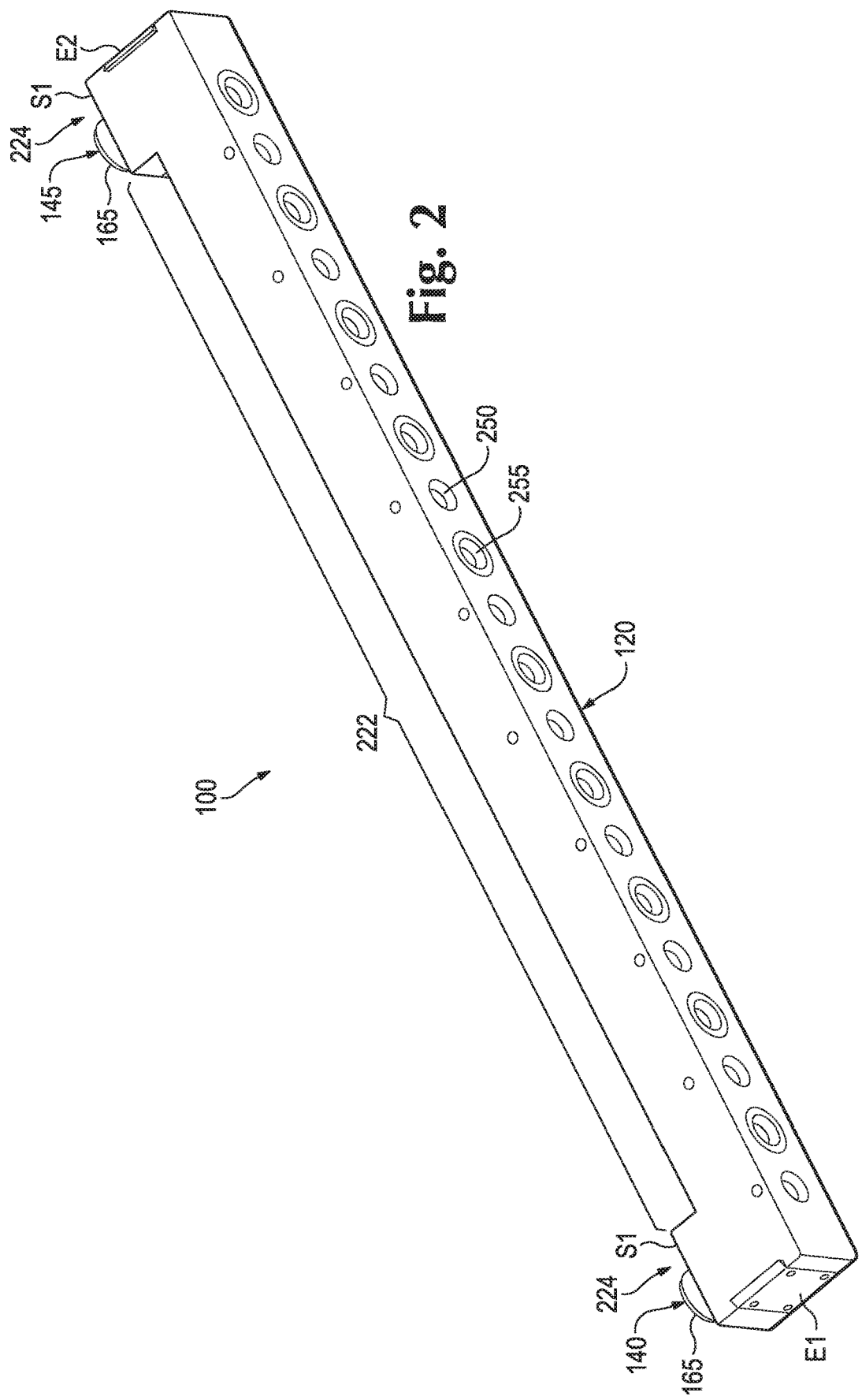
FIG. 2 illustrates a perspective view of the apparatus of FIG. 1 according to an example.

FIG. 2 illustrates a perspective view of the apparatus 100 of FIG. 1 according to an example. The apparatus 100 includes the support member 120 with a slim profile to conform to neighboring structures. For example, the support member 120 illustrated includes a rectangular shaped elongated body 222 that may fit horizontally or vertically along a plurality of servers in a server rack, such as the support structure usable with a 1 U server and accommodates high density electronic devices. For example, the apparatus 100 may fit into a 1.45 inch by 1.73 inch space. The traditional 1 U industry standard increment (1.75 inches). Therefore, the apparatus 100 is usable with a variety of horizontal or vertical oriented servers. The support member 100 illustrated further includes two portions 224 extending from the elongated body 222 approximately perpendicular thereto.

The apparatus 100 as illustrated includes the supply port 140 at one end and the return port 145 at an opposite end of the support member 120, i.e., the supply port 140 is positioned on a first end, E1, and the return port 145 is positioned on a second end, E2. However, the positioning of the supply port 140 and the return port 145 may vary, such that the position of the supply port 140 and the return port 145 may be reversed, depending on the desired advantages. Advantages to consider includes purging air from the apparatus 100 with the return port 145 as high as possible in the apparatus 100 or draining the apparatus 100 by positioning the return port 145 as low as possible on the apparatus 100. Alternatively, the supply port 140 and the return port 145 may be positioned on the same end, i.e., the first end, E1 side by side. For example, a side by side arrangement would allow for an efficient hose connection paths. The supply port 140 and the return port 145 are also illustrated as extending from the same side of the support member 120, a first side, S1, according to the example. Moreover, the support member 120 as illustrated includes the area surrounding the supply port 140 and the return port 145 as extending in an L-shape from the elongated body portion 122 of the support member 120. The supply port 140 and the return ports 145 may each include the port fittings 165 and one of the first sleeve 170 and the second sleeve 175, which are illustrated below in FIGS. 3 and 4A-4B.

The apparatus 100 as illustrated may further include an exterior view of a supply member 250 and a return member 255. The supply member 250 is connected to the supply channel 130 to provide the fluid to a thermal member, such as a thermal bus bar contained in a water wall or connected to a server via direct contact cold plates. The return member 255 is connected to the return channel 135 to receive the fluid from the thermal member. An example of the supply member 250 and the return member 255 is illustrated below in FIGS. 4A-4B. The supply channel 130 and the return channel 135 may be positioned inside the support member 100 as further illustrated in the cross-section of the apparatus 100 in FIG. 3.

Figure 3:
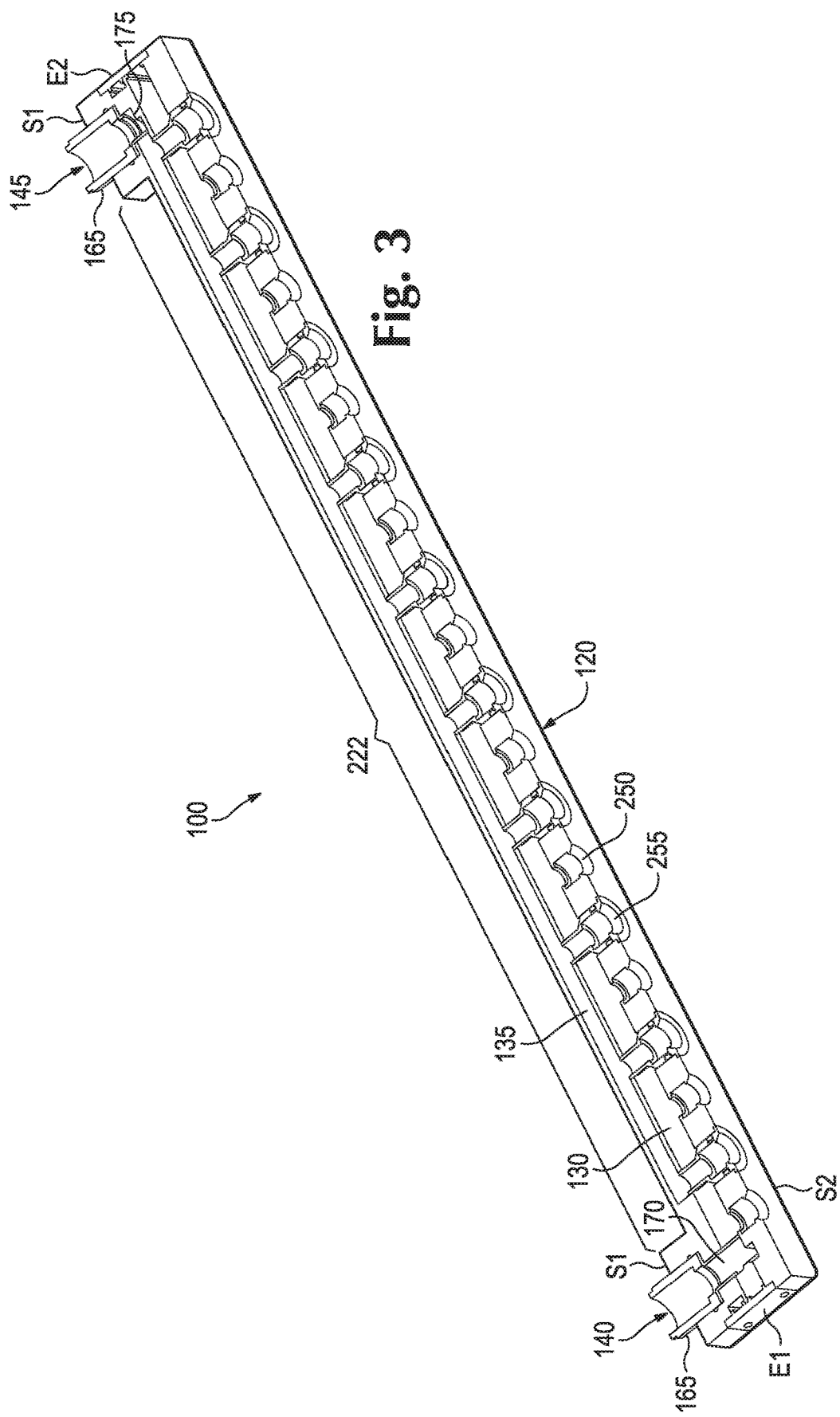
FIG. 3 illustrates a cross-sectional view f the apparatus of FIG. 1 according to an example.

FIG. 3 illustrates a cross-sectional view of the apparatus 100 of FIG. 1 according to an example. Referring to FIG. 3, the supply channel 130 and the return channel 135 are illustrated as two parallel channels formed in the support member 120. For example, the supply channel 130 and the return channel 135 are positioned adjacent to one another or back to back to enable the supply port 140 and the return port 145 openings to extend into and/or through the supply channel 130 and the return channel 135. The supply channel 130 extends in the support member 120 adjacent to a second side, S2. The return channel 135 extends in the support member 120 approximately parallel to the supply channel 130 and adjacent to the first side, S1. The parallel arrangement saves space and enables the manifold to provide supply and return channels 130, 135 that span between the supply port 140 and the return port 145.

The supply port 140 and the return port 145 are each illustrated as an aperture or opening that connects to the supply channel 130 and the return channel 135. Both the supply port 140 and the return port 145 include a port fitting 165. The port fittings 165 illustrated for the supply port 140 and the return port 145 are the same fitting which may be interchangeably used in both the supply port 140 and the return port 145. The port fittings 165 may include a manifold fitting, such as an industrial push-in fitting or a threaded fitting.

The port fitting 165 in the supply port 140 opening includes a first sleeve 170 attached thereto. The first sleeve 170 is illustrated as a cylinder member that extends across the support member 120 through the return channel 135 and into the supply channel 130. The first sleeve 170 as illustrated includes a first length, L1 and a first gasket to form a fluid tight seal between the first sleeve 170 and the supply channel 130 to form a fluid tight seal that prevents the fluid from the supply channel 130 to mix with the return channel 135 and/or leak out of the supply port 140.

The port fitting 165 in the return port 145 opening includes a second sleeve 175 attached thereto. The second sleeve 175 is illustrated as a cylinder member that extends across a portion of the support member 120 into the return channel 135. As illustrated, the second sleeve 175 does not extend into or through the supply channel 130 which is positioned adjacent to the second side, S2, of the support member 120. The second sleeve 175 as illustrated includes a second length, L2, and a second gasket to form a fluid tight seal between the second sleeve 175 and the return channel 135 to form a fluid tight seal that prevents the fluid from the return channel 135 to mix with the supply channel 130 and/or leak out of the return port 145.

Figure 4A:
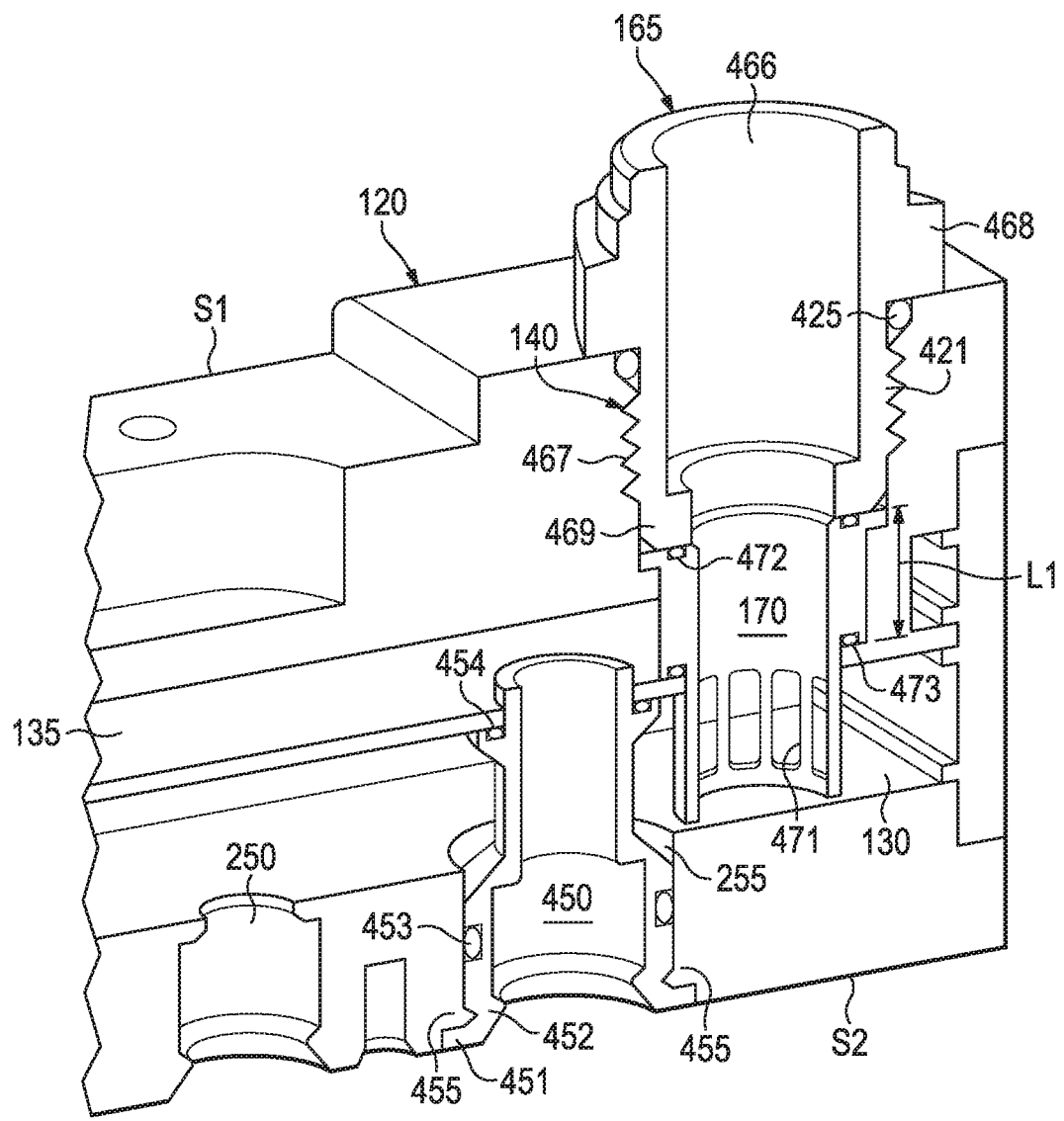
FIGS. 4A-4B illustrate an enlarged view of a portion of the apparatus of FIG. 1 according to an example.
Figure 4B:
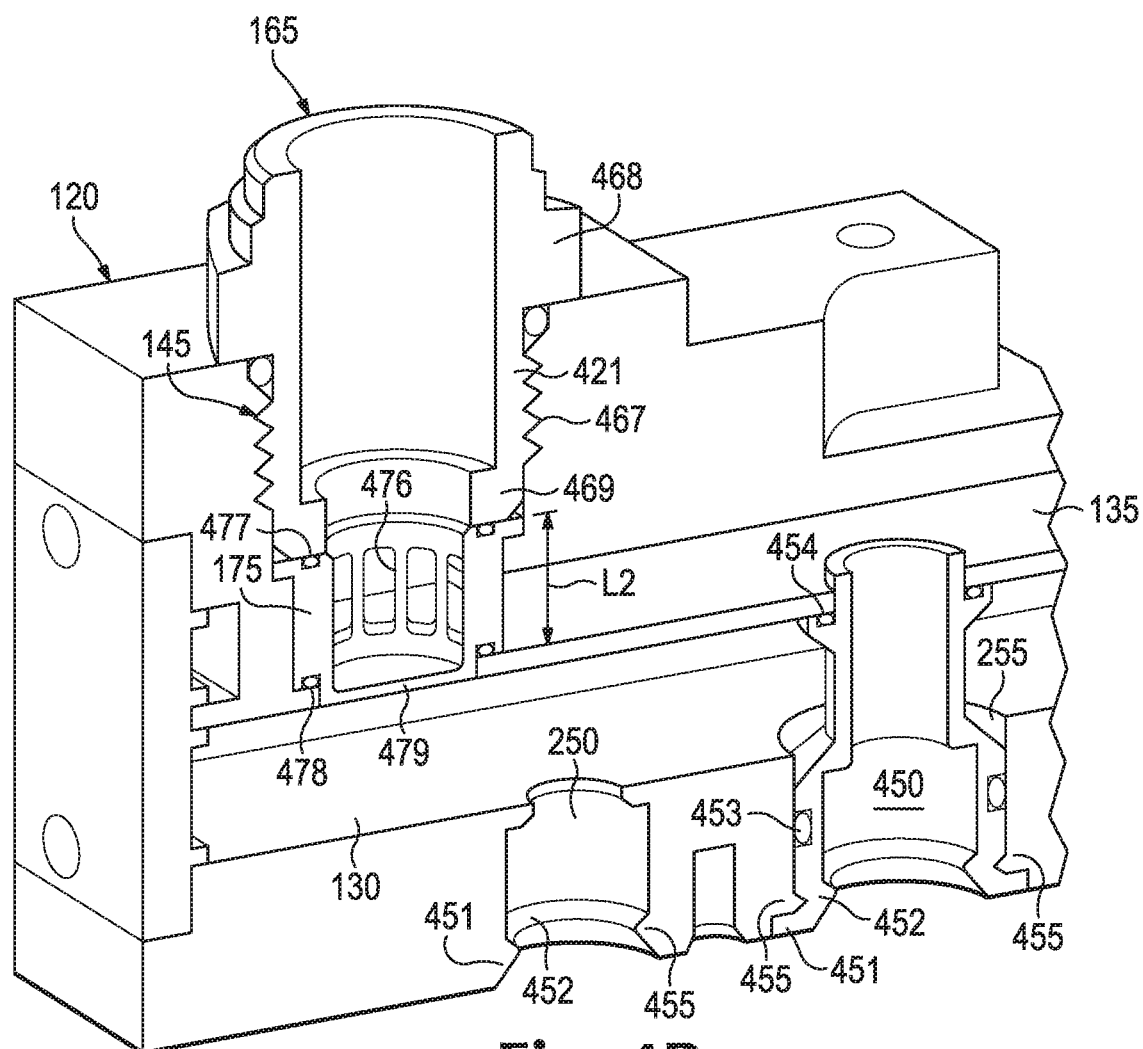

FIGS. 4A-4B illustrate an enlarged cross-sectional view of a portion of the apparatus 100 of FIG. 1 according to an example. FIG. 4A illustrates the cross-sectional view of a portion of the apparatus 100 including the supply port 140, the first sleeve 170, the supply member 250, and the return member 255. FIG. 4B illustrates a cross-sectional view of the return port 145, the second sleeve 175, the return member 255, and the supply member 250. Both the supply port 140 and the return port 145 include the port fitting 165.

Referring to FIGS. 4A-4B, the port fitting 165 is illustrated as a cylindrical member 466 that may be screwed into the supply port 140 and/or the return port 145. The cylindrical member 466, such as a cylinder, and includes a threaded member 467, such as a ridge formed around the outside of the cylinder member 466 in the form of a helix. In the example, the port fitting 165 is a male member with a fitting lip or external end 468 and an external thread (i.e., threaded member 467). The supply port 140 and the return port 145 also includes a threaded member 421, such as a female member with an internal thread. The internal thread may also include a ridge formed within the supply port 140 and the return port 145 in the form of a helix. The external thread and the internal thread mate with one another as the port fitting 165 is rotated, converting the torque into a linear force. Alternatively, the port fitting 165 may be inserted and/or pushed into the supply port 140 and the return port 145 using a push-in fitting.

The port fitting 165 further includes a gasket to provide a fluid tight seal. For example, the port fitting 165 may include a lip 468 that extends from the cylindrical member 466. The fitting gasket 425 may be adjacent to the lip 468 such that the port fitting 165 is inserted into the supply port 140 and/or return port 145. The lip 468 forms a stop for the port fitting 165 and the fitting gasket 425 provides a fluid tight seal to keep the fluid within the apparatus 100. For example, the fitting gasket 425 provides a seal that retains the fluid from the supply channel 130 and/or return channel 135 within the supply port 140 and/or return port 145. The fitting gasket 425 is illustrated as an O-ring seal attached to the port fitting 165; however, other types of gaskets or seals may be used. Moreover, the seal may be attached to the port fitting 165, the supply port 140 or return port 145, and/or form a separate gasket.

The port fitting 165 is illustrated as an interchangeable fitting for both the supply port 140 and the return port 145. For example, the same or identical fitting 165 may be used for both the supply port 140 and the return port 145. As such the port fitting 165 receives the first sleeve 170 or the second sleeve 175 depending on whether the supply port 140 or the return port 145 is connected to the supply channel 130 or the return channel 135, In other words, the position of the supply port 140 and the return port 145 may be reversed or changed based on the configuration and needs of the apparatus 100 for each implementation. Using the apparatus 100, the position of the supply port 140 and the return port 145 may be reversed or changed without adding additional lead time. Moreover, the use of interchangeable port fittings 165 save on inventory costs since the same parts may be used for both implementations.

Referring to FIG. 4A, the first sleeve 170 includes a cylindrical connector of the first length, L1 The first length, L1, in the example formed to provide a path from the supply channel 130 to the supply port 140. The first sleeve 170 includes at least one aperture 471 formed in the cylindrical connector that allows the fluid to flow therethrough and regulation of the pressure. FIG. 4A illustrates the at least one first sleeve aperture 471 as a set of apertures or slots. The first sleeve 170 connects to an internal end 469 of the port fitting 165, i.e., a portion internal to the support member 120. The first sleeve 170 connects to the port fitting 165 via, for example, threads or snap rings that are attached or connected prior to being inserted into the supply port 140 or inserted individually and connected within the supply port 140 to form a sealed connection. FIG. 4A illustrates an example of the first sleeve 170 as first inserted individually through the return channel 135 and into the supply channel 130. Then, the port fitting 165 is inserted into the supply port 140. As the port fitting 165 is inserted into the supply port 140, the port fitting 165 applies a pressure to the first sleeve 170, which compresses all gaskets to achieve the fluid tight seal.

The first sleeve 170 includes a first gasket to form a fluid tight seal between the first sleeve 170 and the supply channel 130. The first gasket includes a first set of gaskets spaced apart thereon to form a fluid tight seal between the first sleeve and the supply channel. For example, the first set of gaskets include a first connector gasket 472 and a first channel gasket 473. The first connector gasket 472 includes a seal member such as an O-ring seal between the internal end 469 of the port fitting 165 and the first sleeve 170. The first channel gasket 473 includes a seal member, such as an O-ring seal between the first sleeve 170 and the return channel 135.

Referring to FIG. 4B, the second sleeve 175 similarly includes a cylindrical connector of a second length, L2. The second length, L2, in the example formed to provide a path from the return port 145 to the return channel 135. The second sleeve 175 includes at least one second sleeve aperture 476 formed in the cylindrical connector that allows the fluid to flow therethrough and regulation of the pressure. FIG. 4B illustrates the at least one second sleeve aperture 476 as a set of apertures or slots. The second sleeve 175 further includes a sleeve plug 479 adjacent to the second sleeve apertures 476 to provide a plug or block that prevents the fluid from entering the adjacent channel, the supply channel 130 in this example. The second sleeve 175 connects to the internal end 469 of the port fitting 165, i.e., a portion internal to the support member 120. The second sleeve 175 connects to the port fitting 165 via, for example, threads or snap rings that are attached or connected prior to being inserted into the return port 145 or inserted individually and connected within the return port 145 to form a sealed connection. FIG. 4B illustrates an example of the second sleeve 175 as first inserted individually into the return channel 135. Then the port fitting 165 inserted into the return port 145. As the port fitting 165 is inserted into the return port 145, the port fitting 165 applies a pressure to the second sleeve 175, which compresses all gaskets to achieve the fluid tight seal.

The second sleeve 175 includes the second gasket illustrated as a second set of gaskets spaced apart from one another to form a fluid tight seal between the second sleeve 175 and the return channel 135. For example, the second set of gaskets include a second connector gasket 477 and a second channel gasket 478. The second connector gasket 477 includes a seal member such as an O-ring seal between the internal end 469 of the port fitting 165 and the second sleeve 175. The second channel gasket 478 includes a seal member, such as an O-ring seal between the second sleeve 175 and the return channel 135. The combination of the gasket and the sleeve plug 479 provides the fluid tight seal to contain the fluid between the return channel 135 and the return port 145. Note, that the return port 145 may extend into the supply channel 130; therefore, the sleeve plug is used to prevent the fluid from moving between the return channel 135 and the supply channel 130.

The first length, L1, of the first sleeve 170 and the second length, L2, of the second sleeve 175 are both distinct lengths. The first sleeve 170 and the second sleeve 175 each have distinct lengths to enable the use of a single fitting 165 with both sleeves, while using the sleeve to determine which channel the port connects to. Referring to FIGS. 4A-4B, the first sleeve 170 has the first length, L1 that is greater than the second length, L2, of the second sleeve 175. In the example illustrated, the first sleeve 170 connects to the supply channel 130 which is positioned adjacent to the second side, S2, of the support member 120, and the second sleeve 175 connects to the return channel 135 which is positioned adjacent to the first side, S1. The size of the sleeves may be reversed if the position of the channels, the ports, and/or the sleeves are also reversed.

The apparatus 100 as illustrated further includes an interchangeable connector or valve for both the supply member 250 and the return member 255. The supply member 250 and the return member 255 each include a retention member 455, such as a barbed or threaded member, to mechanically retain a connector 450. For example, the supply member 250 and the return member 255 are formed of circular apertures that are formed in the support member 120 and extend into and/or through the supply channel 130 and/or the return channel 135. Referring to FIGS. 4A-4B, the supply member 250 extends into the supply channel 130 to allow the fluid to flow therethrough. The return member 255 extends into and through the supply channel 130 and into the return channel 135 to allow the fluid to flow therethrough.

The connector 450 includes a connector lip 451 and a connector engagement member 452 to engage with the supply member 250 and/or return member 255, i.e., the retention member. The connector 450 may further include an axial seal 453 to provide a seal along the supply member 250 and/or return member 255. The connector 450 may optionally include a face seal 454 along the channel to provide a fluid tight seal between the supply member 250 and/or return member 255 and the supply channel 130 and/or return channel 135, For example, the face seal 454 may be positioned between the supply channel 130 and the return channel 135 when the connector 450 passes through the supply channel 130 to provide fluid from the return member 255 to the return channel 135, Moreover, the face seal 454 may include two gaskets or seals and may be held into place with the retention member 455, such as a barbed member. For example, the connector 450 may be a tube that engages with the barbed member (as illustrated in FIGS. 4A-4B) or a threaded valve (as illustrated below in FIG. 6).

The supply port 140 and return port 145 may include a valve or other connection that allows for manual or automatic control of the flow of fluid through the fluid manifold, such as a passive or active valve. For example, the port fitting 165, first sleeve 170, and/or second sleeve 175 may each adjust to increase or decrease the flow of fluid therethrough. Monitoring and control may be performed by a monitor device connected to the manifold and/or a controller for the electronic device. The monitoring and control is further discussed with reference to FIG. 7 below.

Figure 5:
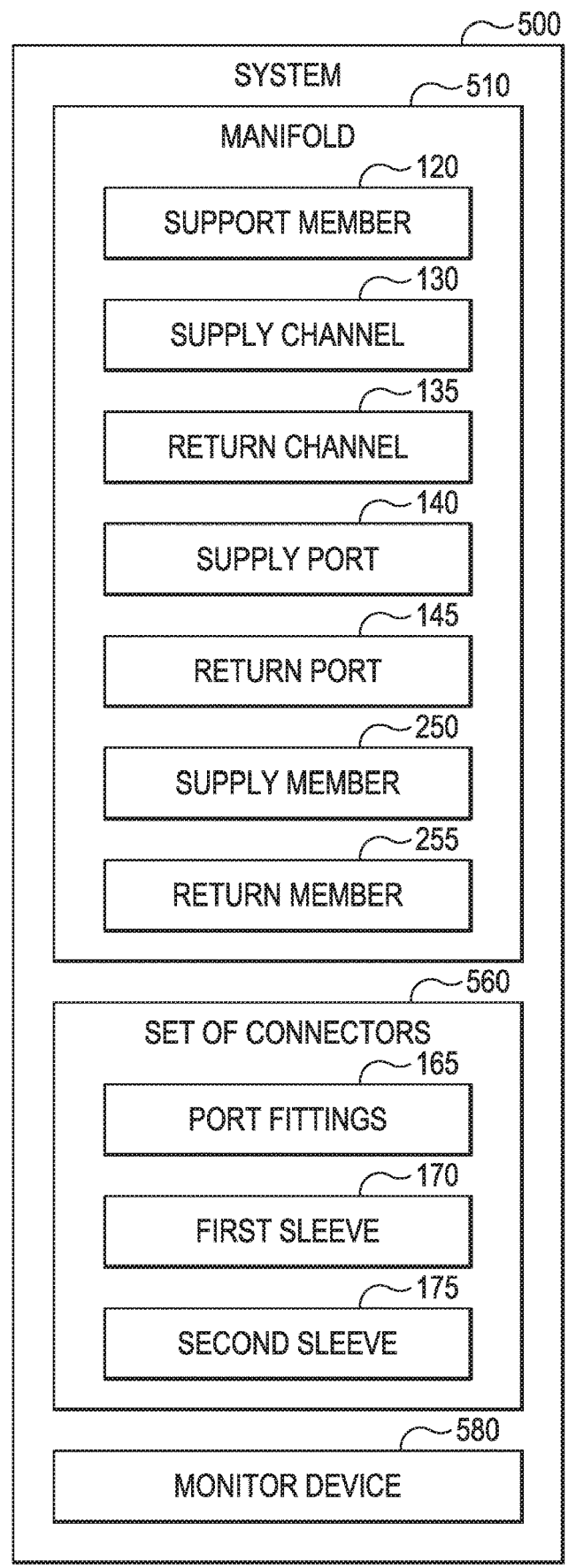
FIG. 5 illustrates a block diagram of a system according to an example.

FIG. 5 illustrates a block diagram of a system 500 according to an example. The system 500 includes a fluid manifold 510, a set of connectors 560, and a monitor device 580. The fluid manifold 510 includes a support member 120, a supply channel 130, a return channel 135, a supply port 140, a return port 145, a supply member 250, and a return member 255. The supply port 140 to provide a fluid to the supply channel 130. The return port 145 to receive the fluid from the return channel 135. The supply member 250 is connected to the supply channel 130 to provide the fluid to a thermal member. The return member 255 is connected to the return channel 135 to receive the fluid from the thermal member.

The set of connectors 560 include at least two port fittings 165, a first sleeve 170, and a second sleeve 175. The at least two port fittings 165 may include for example, a valve that is manually or automatically controllable. The first sleeve 170 is connectable to one of the at least two port fittings 165. The first sleeve 170 includes a first length with a first gasket to form a fluid tight seal between the first sleeve 170 and the supply channel 130. The second sleeve 175 connectable to the other of the at least two port fittings 165. The second sleeve 175 includes a second length with a second gasket to form a fluid tight seal between the second sleeve 175 and the return channel 135.

The monitor device 580 is connected to the fluid manifold 510 to monitor the fluid. For example, the monitor device 580 may be connected directly to the manifold 510 and/or indirectly via the set of connectors 560. The monitor device 580 may be used to monitor the fluid pressure, temperature, and/or flow. The monitor device 580 may further work in combination with the manifold 510 and/or the set of connectors 560 to control the fluid based on the monitoring.

Figure 6:
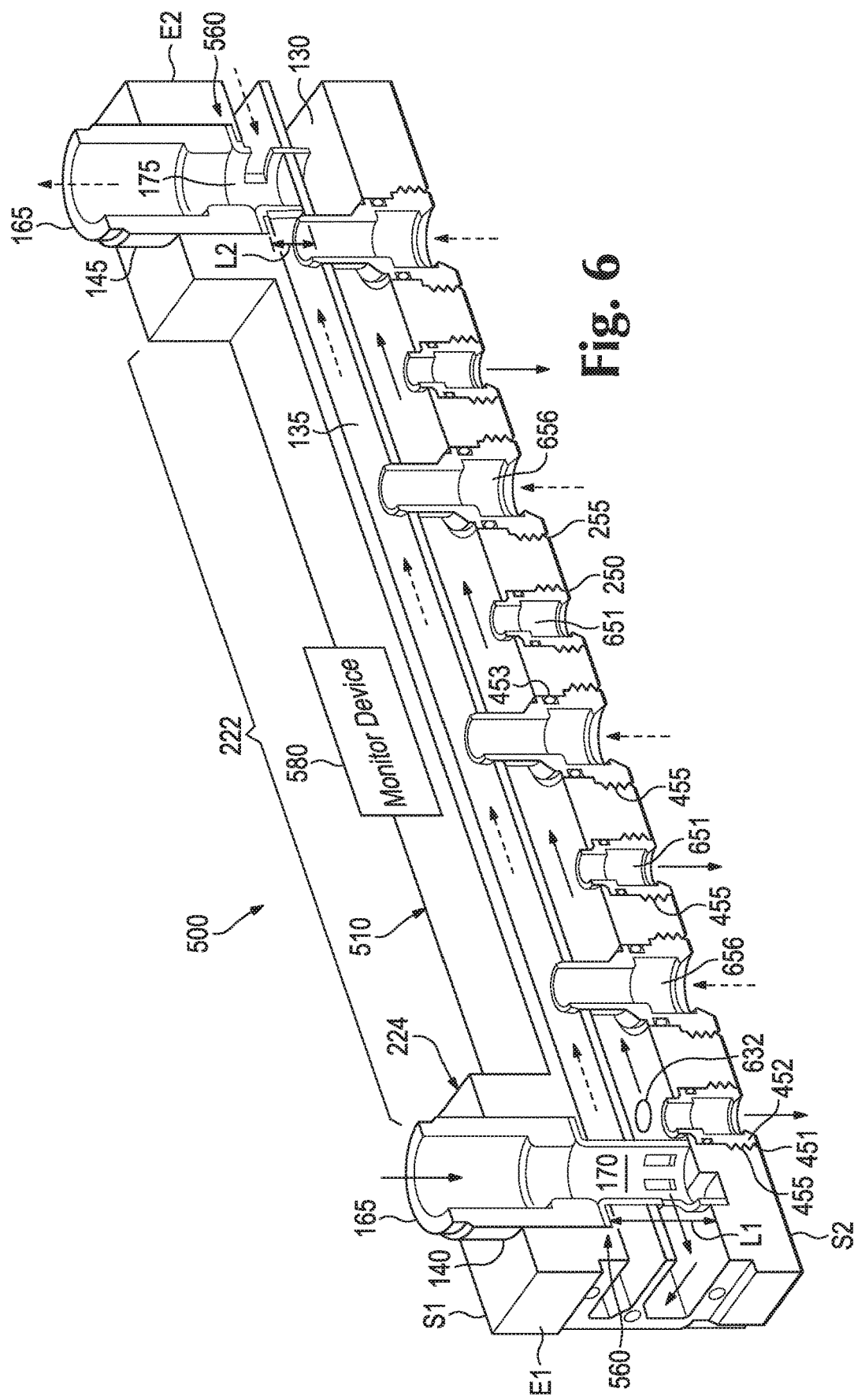
FIG. 6 illustrates a cross-sectional view of the system of FIG. 5 according to an example.

FIG. 6 illustrates a cross-sectional view of the system of FIG. 5 according to an example. The system 500 as illustrated includes the fluid manifold 510, the set of connectors 560, and the monitor device 580.

The fluid manifold 510 includes a support member 120, a supply channel 130, a return channel 135, a supply port 140, a return port 145, a supply member 250, and a return member 255. The support member 120 illustrated includes a rectangular shaped elongated body 222 that may fit horizontally or vertically along a plurality of servers in a server rack, such as the support structure usable with a 1 U server and accommodates high density electronic devices.

Referring to FIG. 6, the supply port 140 is at one end and the return port 145 is at an opposite end of the support member 120, i.e., the supply port 140 is positioned on a first end, E1, and the return port 145 is positioned on a second end, E2. The supply port 140 and the return ports 145 are also illustrated as extending from the same side of the support member 120, a first side, S1. The return channel 135 extends in the support member 120 approximately parallel to the supply channel 130 and adjacent to the first side, S1. The parallel arrangement saves space and enables the manifold to provide a supply and return channels 130, 135 that span between the supply port 140 and the return port 145.

The supply port 140 and the return port 145 are each illustrated as an aperture or opening that connects to the supply channel 130 and the return channel 135. Both the supply port 140 and the return port 145 include a port fitting 165. The port fittings 165 illustrated are the same fitting which may be interchangeably used in both the supply port 140 and the return port 145. The port fittings 165 may include a manifold fitting, such as an industrial push-in fitting or a threaded fitting. The supply port 140 and the return ports 145 may each include the port fittings 165 and one of the first sleeve 170 and the second sleeve 175. At least one sleeve selected from the first sleeve 170 and the second sleeve 175 is to pass through at least one channel selected from the supply channel 130 and the return channel 135. The other sleeve is inserted into the other channel.

For example, the port fitting 165 in the supply port 140 includes a first sleeve 170 attached thereto. The first sleeve 170 is illustrated as a cylinder member that extends across the support member 120 through the return channel 135 and into the supply channel 130. The first sleeve 170 as illustrated includes a first length, L1, and a first gasket to form a fluid tight seal between the first sleeve 170 and the supply channel 130 to form a fluid tight seal that prevents the fluid from the supply channel 130 to mix with the return channel 135 and/or leak out of the supply port 140.

The port fitting 165 in the return port 145 opening includes a second sleeve 175 attached thereto. The second sleeve 175 is illustrated as a cylinder member that extends across a portion of the support member 120 into the return channel 135. As illustrated, the second sleeve 175 does not extend into or through the supply channel 130 which is positioned adjacent to the second side, S2, of the support member 120. The second sleeve 175 as illustrated includes a second length, L2, and a second gasket to form a fluid tight seal between the second sleeve 175 and the return channel 135 to form a fluid tight seal that prevents the fluid from the return channel 135 to mix with the supply channel 130 and/or lead out of the return port 145.

The supply channel 130 and/or the return channel 135 may further include a pressure balancing member 632 to control the flow of fluid therein. For example, the supply channel 130 and/or supply member 250 closest to the supply port 140 includes the pressure balancing member 632 to control or slow the flow of the fluid into the first thermal member and evenly distribute the flow of the fluid to the remaining supply members 250. The pressure balancing member 632 may include for example, one or a plurality of protrusions along the supply channel.

The system 500 may include the connector 450 or valve for both the supply member 250 and the return member 255. The supply member 250 and the return member 255 each include a retention member 455, such as a barbed or threaded member, to mechanically retain a connector. For example, the supply member 250 and the return member 255 are formed of circular apertures that are formed in the support member 120 and extend into and/or through the supply channel 130 and/or the return channel 135. The supply member 250 extends into the supply channel 130 to allow the fluid to flow therethrough. The return member 255 as illustrated extends into and through the supply channel 130 and into the return channel 135 to allow the fluid to flow therethrough. The supply member 250 may include a supply member gasket to provide a fluid tight seal between the supply member 250 and a supply connector 651. The return member 255 may include a return member gasket to provide a fluid tight seal between the return member 255 and the return connector 656.

The retention member 455 in a supply member channel to receive a supply connector 651, such as a valve or a tube. The retention member 455 is illustrated as a threaded member that receives a threaded valve. For example, the threaded member is a female member that mates with a threaded valve that is a male member. The supply member 250 includes at least one of the following supply connectors 651 selected from a tube, a solenoid valve and a passive valve. The retention member 455 in the return member 255 to receive a return connector 656, such as a valve or a tube. The return member 255 includes at least one of the following return connectors 656 selected from a tube, a blind mate dripless connector, a solenoid valve, an active valve, and a passive valve. The supply member 250 and the return member 255 may alternatively include low drip connector and/or a connectors that may be installed manually, with or without a tool.

Referring to FIG. 6, the flow of the fluid in the fluid manifold is illustrated. The fluid may include, for example, water, oil, air, and/or a combination thereof. The solid line indicates the supply path and the single dashed line indicates the return path. The fluid enters the fluid manifold 510 through the supply port 140 via one of the at least two port fittings 165 and flows into the supply channel 130 via the first sleeve 170. The first sleeve 170 extends through the return channel 135 and into the supply channel 130. The fluid moves along the supply channel 130, passing over the pressure balancing member 632 and flows into the supply member 250 to provide fluid to the thermal members. The fluid that is provided to the fluid manifold may be a temperature that is determined to cool an electronic device that the thermal member is connected to.

The fluid also enters the fluid manifold 510 through return member 255, which receives the fluid from the thermal member. The fluid from the thermal member may be heated from the electronic device it is connected to. The fluid flows into the return channel 135 via the return connector 656 that extends into the through the supply channel 130 and into the return channel 135. The fluid flows from the return channel 135 to the second sleeve 1745 and into the other of the at least two port fittings 165, which enables the fluid to flow out of the fluid manifold 510. The port fittings 165, the first sleeve 170, the second sleeve 175, the supply member 250, and the return member 255 each include gaskets or seals to provide a fluid tight path for the fluid to flow within the fluid manifold 510.

Figure 7:
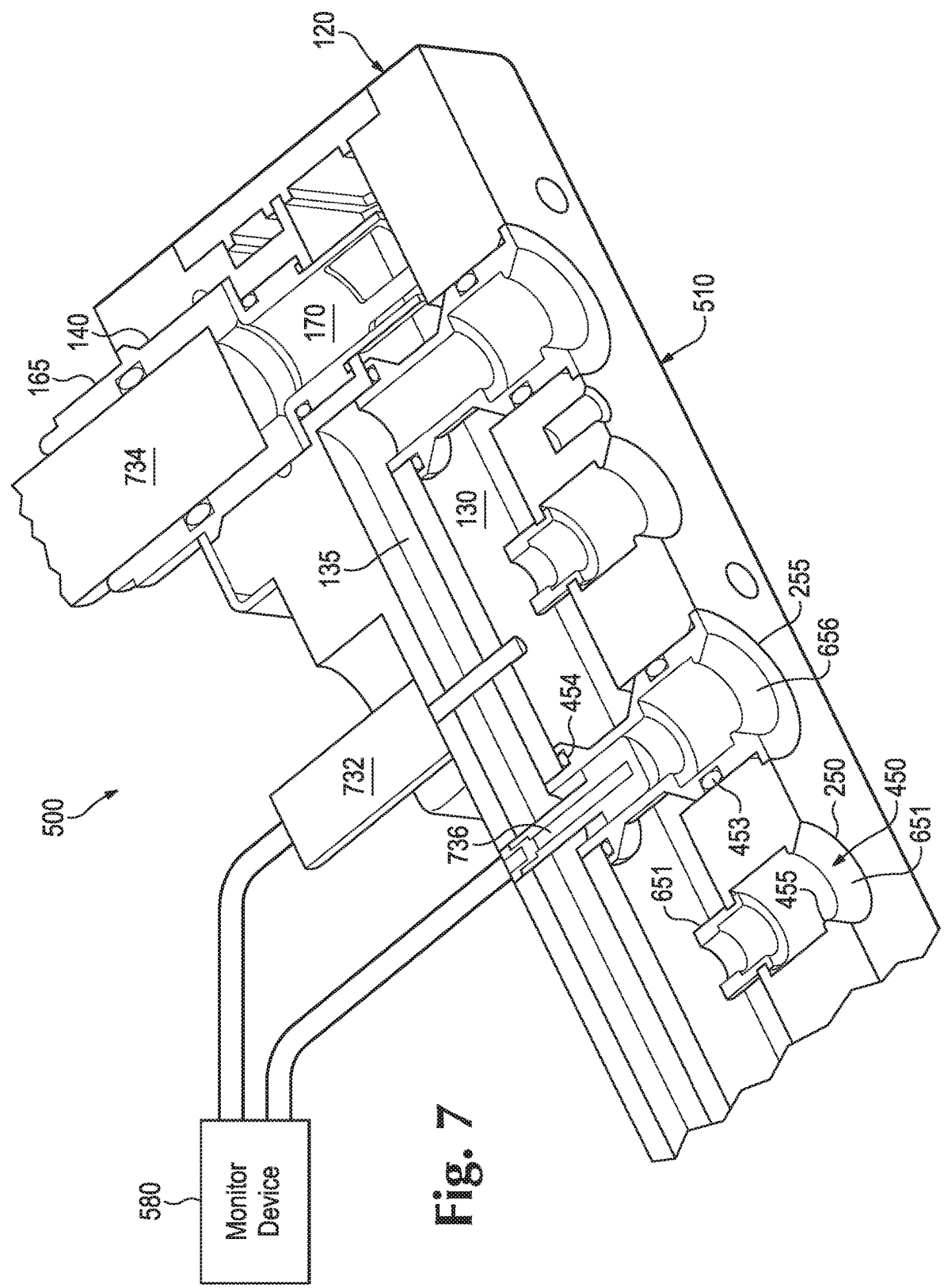
FIG. 7 illustrates an enlarged view of a portion of the system of FIG. 5 according to an example.

FIG. 7 illustrates an enlarged view of a portion of the system of FIG. 5 according to an example. The system 500 includes the fluid manifold 510, the port fitting 165, and a monitor device 580. The monitor device 580 is illustrated as monitoring the fluid in the supply channel 130 and the return member 255. For example, the supply channel 130 may include a temperature monitor 732, the supply port may include a flow monitor 734, and the return member 255 may include a pressure monitor 736.

The monitor device 580 may be connected to monitors such as a fluid monitor to monitor at least one of the following attributes of the fluid selected from a temperature of the fluid, a flow rate of the fluid, and a pressure of the fluid. For example, the monitor device 580 may be connected to a variety of sensors, including but not limited to a thermocouple, a temperature tap, a temperature sensor, a fluid flow sensor or monitor, a pressure sensor, and/or a pressure transducer. Each of the sensors may be connected to the support member 120 and remain in contact with the fluid in the supply channel 130, the return channel 135, or with both at the same time.

Moreover, the supply port 140 and return port 145 may include a valve or other connection that allows for manual or automatic control of the flow of fluid through the fluid manifold 510, such as a passive or active valve. For example, the port fitting 165, first sleeve 170, and/or second sleeve 175 may each adjust to increase or decrease the flow of fluid therethrough. Monitoring and control may be performed by a monitor device 580 connected to the manifold and/or a controller for the electronic device.

Figure 8:
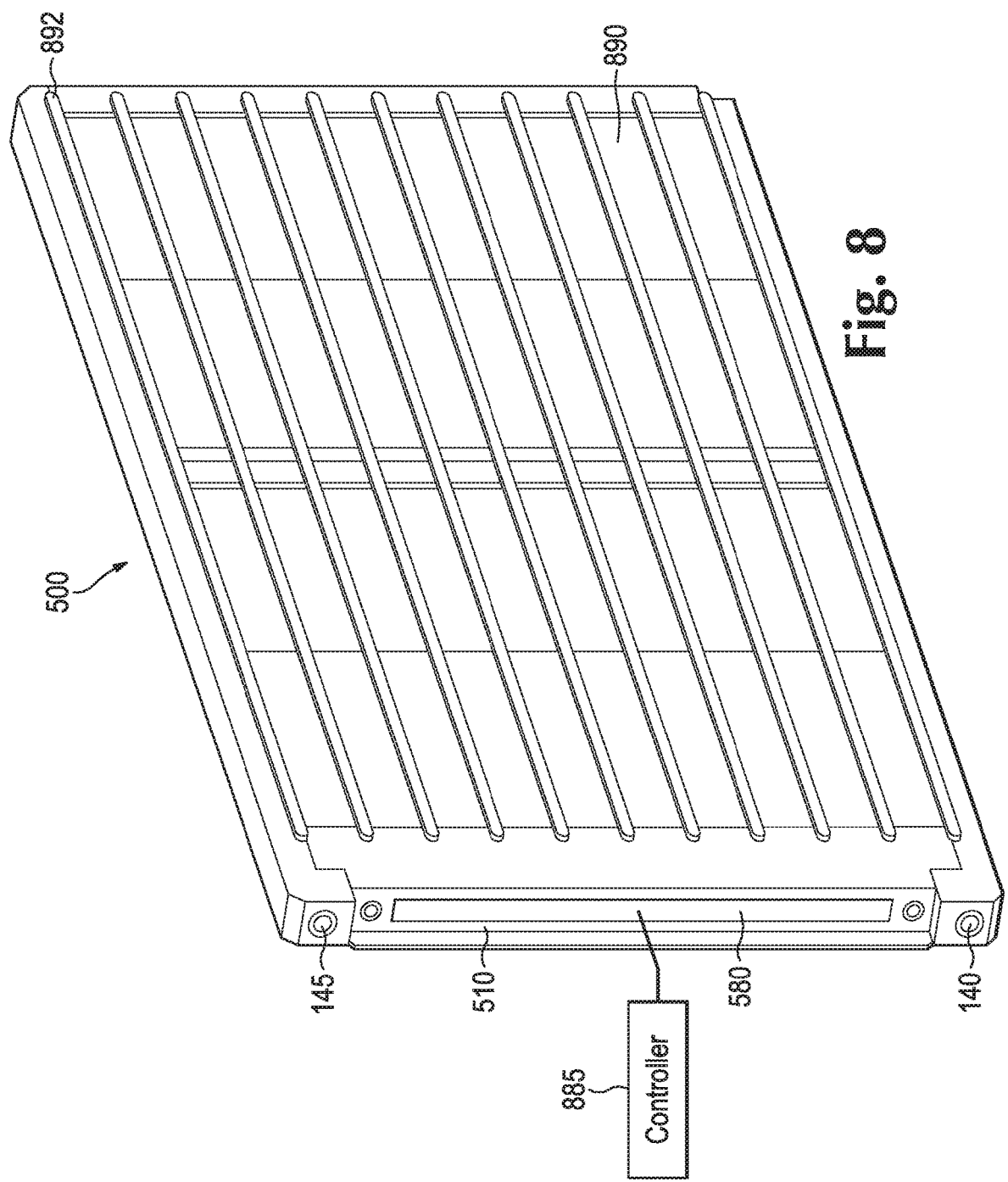
FIG. 8 illustrates the system of FIG. 5 connected to a water wall.

FIG. 8 illustrates the system 500 of FIG. 5 connected to a water wall 892. The system 500 is illustrated as a vertical fluid manifold 510 connected to a thermal member 890, such as a cooling module and/or a thermal bus bar assembly. The system 500 connected to the thermal member 890 forms a water wall 892 that provides liquid cooling through a dry disconnect water wall. Specifically, the water wall 892 circulates water into the thermal members 890. The thermal members 890 are formed of a conductive material that receives the heat from the electronic device adjacent thereto. For example, the thermal member 890 may be positioned adjacent to a heat block that is along the edge of the electronic device.

The fluid manifold 510 includes a supply port 140 on the bottom of the water wall 892 and a return port 145 on the top of the water wall 892; however, the position may be reversed or changed, for example, the supply port 140 may be on the top of the water wall 892 and the return port 145 may be on the bottom of the water wall 892, or both the supply port 140 and the return port 145 may be adjacent to one another on the top or the bottom of the water wall 892. The system 500 further includes a monitor device 580 in the middle portion of the fluid manifold 510. The monitor device 580 may connect to a controller 885 that controls not only the system 500 with the fluid, but also other portions of the electronic device or system. For example, the monitor device 580 may receive a signal from a controller 885, such as a rack controller, that indicates more or less fluid is needed. Based on that signal, the port fitting 165, first sleeve 170, and/or second sleeve 175 may open to increase the flow of fluid or close to decrease the flow of fluid. Additionally, the monitor device 580 may detect when more or less fluid is needed and the port fitting 165, first sleeve 170, and/or second sleeve 175 may open or close based on the monitoring device 580. Moreover, the monitor device 580 may communicate the information detected and actions to the controller for further recording or acknowledgement.

The present disclosure has been described using non-limiting detailed descriptions of examples thereof and is not intended to limit the scope of the present disclosure. It should be understood that features and/or operations described with respect to one example may be used with other examples and that not all examples of the present disclosure have all of the features and/or operations illustrated in a particular figure or described with respect to one of the examples. Variations of examples described will occur to persons of the art. Furthermore, the terms "comprise," "include," "have" and their conjugates, shall mean, when used in the present disclosure and/or claims, "including but not necessarily limited to."

It is noted that some of the above described examples may include structure, acts or details of structures and acts that may not be essential to the present disclosure and are intended to be exemplary. Structure and acts described herein are replaceable by equivalents, which perform the same function, even if the structure or acts are different, as known in the art. Therefore, the scope of the present disclosure is limited only by the elements and limitations as used in the claims.

What is claimed is:

1. An apparatus, comprising:
    a first fluid channel;
    a second fluid channel separated from the first channel by a divider;
    two ports, each port comprising an opening into the first fluid channel, wherein the divider includes two apertures, each aperture corresponding to one of the two ports;
    a first sleeve; and
    a second sleeve, the first sleeve and the second sleeve interchangeably insertable into the two ports such that:

when the first sleeve is inserted into either port of the two ports, the first sleeve extends through the first fluid channel to the second fluid channel and fluidly connects the second fluid channel to the port into which the first sleeve is inserted, and the first sleeve passes through the aperture corresponding to the port into which the first sleeve is inserted to fluidly connect to the second fluid channel; and when the second sleeve is inserted into another port of the two ports, the second sleeve fluidly connects the first fluid channel to the other port, and the second sleeve plugs the aperture corresponding to the other port.

2. The apparatus of claim 1, wherein the first sleeve includes a gasket to contact the divider to seal around the aperture corresponding to the port into which the first sleeve is inserted.

3. The apparatus of claim 1, wherein the second sleeve includes a gasket to contact the divider and to seal around the aperture corresponding to the other port when the second sleeve is inserted into the other respective port.

4. The apparatus of claim 1, wherein the first channel is a return channel, and the second channel is a supply channel.

5. The apparatus of claim 4, further comprising:
a supply member connected to the supply channel to provide fluid to a thermal member; and
a return member connected to the return channel to receive the fluid from the thermal member.

6. The apparatus of claim 1, wherein the first sleeve and the second sleeve include slots to allow the fluid to flow therethrough to regulate pressure in the second fluid channel and the first fluid channel, respectively.

7. A system comprising:
a fluid manifold including:
a first fluid channel;
a second fluid channel separated from the first channel by a divider; and
two ports, each comprising an opening into the first fluid channel, wherein the divider includes two apertures, each aperture corresponding to one of the two ports;
a set of connectors including:
a first sleeve; and
a second sleeve, the first sleeve and the second sleeve interchangeably insertable into the two ports such that:
when the first sleeve is inserted into either port of the two ports, the first sleeve extends through the first fluid channel to the second fluid channel and fluidly connects the second fluid channel to the port into which the first sleeve is inserted, and the first sleeve passes through the aperture corresponding to the port into which the first sleeve is inserted to fluidly connect to the second fluid channel; and when the second sleeve is inserted into another port of the two ports, the second sleeve fluidly connects the first fluid channel to the other port, and the second sleeve plugs the aperture corresponding to the other port; and a monitor device connected to the fluid manifold to monitor fluid.

8. The system of claim 7, wherein the first sleeve includes a gasket to contact the divider to seal around the aperture corresponding to the port into which the first sleeve is inserted.

9. The apparatus of claim 7, wherein the second sleeve includes a gasket to contact the divider to seal around the aperture corresponding to the other port when the second sleeve is inserted into the other port.

10. The system of claim 9, wherein the supply member comprises a supply connector, and the return member comprises a return connector.

11. The apparatus of claim 7, wherein the first channel is a return channel, and the second channel is a supply channel.

12. The apparatus of claim 11, wherein the fluid manifold further comprises:
a supply member connected to the supply channel to provide the fluid to a thermal member; and
a return member connected to the return channel to receive the fluid from the thermal member.

13. The system of claim 12, wherein the supply member comprises a first retention member to receive a supply connector, and wherein the return member comprises a second retention member in a return member channel to receive a return connector.

14. The system of claim 13, wherein the supply member further comprises a supply member gasket to provide a fluid tight seal between the supply member and the supply connector, and wherein the return member further comprises a return member gasket to provide a fluid tight seal between the return member and the return connector.

15. The system of claim 7, wherein the monitor device comprises a temperature tap.

16. The system of claim 7, wherein the monitor device comprises a pressure monitor.

17. The system of claim 7, wherein the monitor device comprises a fluid flow monitor.

18. The system of claim 7, wherein the first sleeve and the second sleeve include slots to allow the fluid to flow therethrough.

* * * * *